United States Patent [19]

Luryi

[11] Patent Number: 5,329,144
[45] Date of Patent: Jul. 12, 1994

[54] HETEROJUNCTION BIPOLAR TRANSISTOR WITH A SPECIFIC GRADED BASE STRUCTURE

[75] Inventor: Serge Luryi, Bridgewater, N.J.

[73] Assignee: AT&T Bell Laboratories, Murray Hill, N.J.

[21] Appl. No.: 52,352

[22] Filed: Apr. 23, 1993

[51] Int. Cl.$^5$ ............... H01L 31/072; H01L 31/109; H01L 27/082
[52] U.S. Cl. ............................ 257/197; 257/198; 257/592
[58] Field of Search ............ 257/197, 198, 592, 591, 257/593

[56] References Cited

FOREIGN PATENT DOCUMENTS 3-138949 6/1991 Japan .................. 257/198

OTHER PUBLICATIONS

"Bipolar Transistor with Graded Band-gap Base"; Hayes et al; Electronics letters, vol. 19, p. 410, 1983.
"Physics of Semiconductor Devices", by S. M. Sze, 2nd Edition, John Wiley & Sons, 1981, Chapter 3.
"Subpicosecond InP/InGaAs Heterostructure Bipolar Transistors", by Y. Chen et al., IEEE Electron Device Letters, vol. 10, No. 6, Jun. 1989, pp. 267-269.
"Small-Signal Theory of the Transistor Transit-Time Oscillator (Translator)", by G. T. Wright, *Solid State Electronics*, 1979, vol. 22, pp. 399-401.
"Frequency Dependence of the Unilateral Gain in Bipolar Transistors", by S. Tiwari, *IEEE Electron Device Letters*, vol. 10, No. 12, Dec. 1989, pp. 574-576.
"Negative Resistance Arising from Transit Time in Semiconductor Diodes", by W. Shockley, The Bell System Technical Journal, vol. 33, No. 4, p. 799, Jul. 1954.
"A Unipolar Transistor With Negative Output Resistance", by N. Dagli, Solid-State Electronics, vol. 33, No. 7, pp. 831-836, 1990.
"(GaAl)As/GaAs Heterojunction Bipolar Transistors With Graded Composition in the Base", by D. L. Miller, Electronics Letters, vol. 19, p. 367, 1983.
"Bipolar Transistor With Graded Band-gap Base", by J. R. Hayes, Electronics Letters, vol. 19, p. 410 (1983).

*Primary Examiner*—Rolf Hille
*Assistant Examiner*—Wael Fahmy
*Attorney, Agent, or Firm*—Eugen E. Pacher

[57] ABSTRACT

The disclosed novel heterojunction bipolar transistor, to be referred to as the enhanced diffusion transistor (EDT), comprises a base of composition selected such that the base bandgap narrows from emitter towards collector in substantially step-wise fashion, resulting in N (N≥2) substantially flat levels in the base bandgap. The height $\Delta_j$ of the steps in the bandgap is greater than kT (typically at least about 30 meV), and also greater than the threshold energy of an appropriate rapid inelastic minority carrier scattering mechanism (e.g., optical phonon scattering, plasmon scattering) in the base material. The presence of the "steps" in the base bandgap of the EDT can, in consequence of the resulting strongly accelerated diffusive minority carrier transport in the base, lead to, e.g., improved high frequency characteristics, as compared to otherwise identical prior art (N=1) transistors.

7 Claims, 1 Drawing Sheet

HETEROJUNCTION BIPOLAR TRANSISTOR WITH A SPECIFIC GRADED BASE STRUCTURE

FIELD OF THE INVENTION

This application pertains to heterojunction bipolar transistors (HBTs).

BACKGROUND OF THE INVENTION

Since the invention of the transistor in 1947, much effort has been directed towards extension of the device operating range towards higher and higher frequencies.

Conventionally, the cut-off frequency $f_T$ (defined as the frequency at which the current gain $\beta$, i.e., the absolute value of the parameter $h_{fe} \equiv \partial J_C / \partial J_B$, is unity) is used as a figure of merit that is indicative of the high frequency capability of a transistor. See for instance, S. M. Sze, "Physics of Semiconductor Devices", 2nd Edition, John Wiley & Sons, 1981, Chapter 3, incorporated herein by reference. It is well known that $\beta$ at high frequencies decreases at a rate of 10 dB/decade, i.e. proportionally to inverse frequency.

Another parameter that can be used to characterize the high frequency capabilities of a (typically microwave) transistor is the unilateral (power) gain U. See S. M. Sze, op. cit., pp. 160–165. It is well known that U at high frequencies decreases at the rate of 20 dB/decade, i.e., proportionally to inverse square of the frequency. The frequency at which the unilateral gain is unity is the maximum oscillating frequency $f_{max}$, which can, but need not, be larger than $f_T$. Both $f_T$ and $f_{max}$ are conventionally determined by extrapolation of the measured roll-off in $h_{fe}$ and U, respectively. Although HBTs having $f_T$ substantially above 100 GHz have recently been reported (see, for instance, Y. K. Chen, et al. *IEEE Electron Dev. Lett.*, Vol. 10, No. 6, p. 267, 1989), it would clearly be highly desirable to have available transistors that can, inter alia, operate at even higher frequencies.

G. T. Wright, (see, for instance, *Solid State Electronics*, Vol. 22, p. 399, 1979) proposed extension of active transistor operation to frequencies beyond the conventional cutoff frequencies. The proposal involved the utilization of transit time resonances that arise from carrier drift in the collector space charge region, resulting in a negative output resistance of the transistor. The proposed model suggested for an ideal transistor (i.e., a transistor without any parasitic extrinsic impedances) the possibility that $|U|$ could exceed unity at frequencies above $f_{max}$. However, it has now been shown (S. Tiwari, *IEEE Electron Device Letter*, Vol. 10, No. 12, p. 574, 1989) that the proposed utilization of the collector transit time resonances in a conventional GaAs/AlGaAs HBT would require reductions of each of the base and collector resistances and of the collector capacitance by at least an order of magnitude from state of the art values. Clearly, the proposed mechanism is, at least for the foreseeable future, not likely to be embodied in a practical device. Recent analysis shows that the indicated difficulty in utilization of the collector transit-time effect arises because of a relatively large decrease (by at least a factor of three) in the magnitude of the common-base current gain, which is in principle unavoidable if a necessary transit angle of order 180 degrees is acquired in carrier transit across the collector space-charge region. The resultant gain is so weak that it is practically damped by parasitic extrinsic impedances.

Almost 40 years ago it was suggested (W. Shockley, *Bell System Technical Journal*, Vol. 33, p. 799) that active transistor behavior above the conventional transit time cutoff could be obtained from the base transport of minority carriers. A necessary condition for this is that the directed minority carrier transport across the base is much faster than the diffusive transport. In principle, this condition could be met in a transistor with exponentially graded base doping profile. To the best of my knowledge, no such device has ever been realized.

U.S. patent application Ser. No. 07/981,588, filed Nov. 25, 1992 and incorporated herein by reference, discloses a "coherent" ballistic transistor capable of providing gain at frequencies above the conventional cut-off frequency. The coherent transistor employs the base transit angle and therefore is much less susceptible to the parasitic damping than previous proposals utilizing the collector transit angle. However, because of the requirement that the minority carrier transport across the base be ballistic, practical realizations of the disclosed are likely to be restricted to low-temperatures and ultra-high frequencies (exemplarily well above 100 GHz).

It would clearly be desirable to have available a transistor that can operate at room temperature, exhibiting transit time resonances at frequencies above the conventional cutoff frequencies. Moreover, it would be desirable to be able to choose the resonant frequency in a wide range, not necessarily above 100 GHz.

This application discloses such a transistor. The novel device, to be referred to as the "enhanced diffusion" transistor (EDT), has utility in many fields, e.g., high speed computation or communications.

SUMMARY OF THE INVENTION

Broadly speaking, the invention is a novel HBT that can exhibit power gain (preferably also current gain) at frequencies above the conventionally defined $f_T$ and $f_{max}$ of an appropriate prior art comparison transistor.

More specifically, the invention typically is embodied in an article that comprises a HBT that compromises first, second and third semiconductor regions, to be referred to as emitter, base and collector, respectively. The article also comprises means for electrically contacting the emitter, base and collector, respectively. The base is intermediate the emitter and collector and has a width $W_B$. The emitter and collector each comprises material of a first (typically n) conductivity type, and the base comprises material of a second (typically p) conductivity type. Associated with the transistor is a current gain $\beta$ and unilateral power gain U. Significantly, the base region is selected such that the base bandgap narrows from emitter towards collector in substantially step-wise fashion, resulting in N(N≧2) substantially flat levels in the base bandgap. The steps are of height $\Delta_j \geq kT$ (k is Boltzmann's constant, T is the transistor operating temperature), typically at least 30 meV, and greater than the threshold energy ($\Delta_{inelastic}$) of an appropriate rapid inelastic carrier scattering mechanism e.g., optical phonon scattering, plasmon scattering). As will be described below, the presence of "steps" in the base bandgap makes it possible to obtain active behavior of the transistor at higher frequencies than in an otherwise identical conventional (N=1) transistor. The improved high frequency behavior of the EDT is a consequence of strongly accelerated diffusive minority carrier motion in the base, due to the presence of the bandgap steps, and does not require "ballistic" carrier motion.

DETAILED DESCRIPTION

Figure 1:
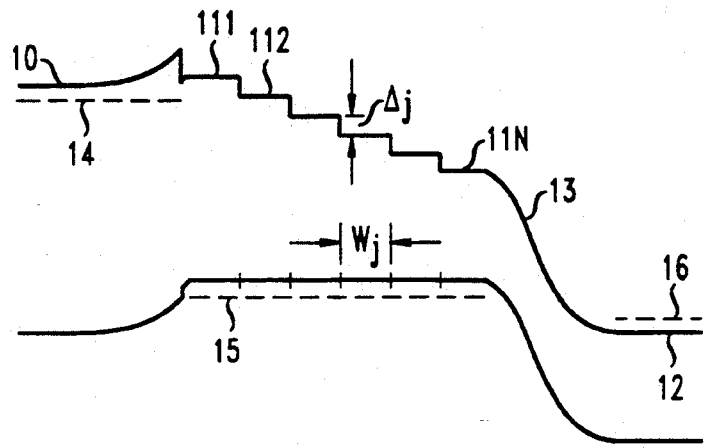
FIG. 1 schematically depicts the band diagram of an exemplary EDT.

FIG. 1 schematically shows the band diagram of an exemplary EDT. Band diagrams are well known to those skilled in the art. Numeral 10 designates the emitter conduction band edge, 12 the collector conduction band edge, 13 the space charge region conduction band edge, and 111-11N the N discrete conduction band levels in the base. The base contains N-1 substantially step-wise changes in composition, and consequently has N distinct base band edge levels. Although FIG. 1 shows steps of essentially equal height (i.e., $\Delta_j$) and levels of essentially equal width (i.e., $W_j$), this is not a requirement. Exemplarily, the emitter is of composition $Al_{0.4}Ga_{0.6}As$ and comprises a $n^{++}$ (e.g., $10^{19}$ Si/cm$^3$) contact layer, a $n^+$ (e.g., $10^{18}$ Si/cm$^3$) intermediate layer, and a n (e.g., $10^{17}$ Si/cm$^3$; 20-30 nm thickness) layer in contact with the base. Such emitters are known. Furthermore, the collector exemplarily is GaAs and comprises a substantially undoped space charge region (e.g., about 100 nm thickness) and $n^+$ (e.g., $5 \times 10^{18}$ Si/cm$^3$) collector region. The ($n^{++}$, e.g., $10^{19}$ Be/cm$^3$) base exemplarily has 10 layers of nominal compositions $Al_{0.36}Ga_{0.54}As$, $Al_{0.32}Ga_{0.58}As$, ..., $Al_{0.04}Ga_{0.96}As$, respectively, resulting in $\Delta_j$ of about 60 meV. Numerals 14-16 refer to the emitter, base and collector Fermi levels, respectively. It is known that in heavily p-type base material essentially the entire bandgap discontinuity (e.g., $\Delta_j$) appears as a step in the conduction band edge.

The following discussion pertains to a transistor of the type exemplified by FIG. 1, and is provided for pedagogical reasons. For simplicity's sake it is assumed that all $\Delta_j$ as well as all $W_j$ are equal. It is assumed that $\Delta_j$ is much greater than kT, preferably at least 2 or 3 kT. This condition is easily met, even for room temperature operation, in, e.g., the GaAs/AlGaAs system, and assures that carriers are effectively inhibited to return once they have "fallen off" a particular step.

If, furthermore, $\Delta_j$ is greater than the threshold energy for a rapid inelastic carrier scattering process (e.g., $\Delta_j \gtrsim h\nu_{opt}$, where h is Planck's constant and $\nu_{opt}$ is the optical phonon frequency in the relevant base material) then one can consider the carrier transport on each level individually, and characterize it by a transport factor $\alpha_j$, where $$\alpha_j(\omega) = [\cosh(2i\phi_j)^{\frac{1}{2}}]^{-1}, \quad (1)$$

with $\omega$ being angular frequency, $\phi_j = \omega\tau_j$ is the phase acquired in transit across step j, and $\tau_j = W_j^2/2D$ is the step propagation time by diffusion, with D being the minority carrier diffusivity in the base material. Equation (1) represents a well-known expression for the transport factor in the absence of recombination. For the acquired phase ($\phi_j$) much less than unity, it reduces to the following approximate expression:

$$\alpha_j(\omega) \sim \exp(-\phi_j^2/3) \cdot \exp(-i\phi_j), \quad (2)$$

which is valid neglecting cubic and higher order terms in $\phi_j$. Equation (2) shows that $|\alpha_j|$ deviates from unity quadratically in $\phi_j$.

The base transport factor $\alpha_B$ is the product of the $\alpha_j$'s, namely $$\alpha_B = \prod_{j=1}^{N} \alpha_j \quad (3)$$

Under the above stated conditions, any given $\alpha_j$ is independent of the others, and for sufficiently short $W_j$ the step transport factors are given by Eq. (2). For N equal steps, the overall base transport factor, (Eq. 3) reduces to $$\alpha_B = \exp(-\phi^2/3N) \cdot \exp(-i\phi), \quad (3a)$$

where $\phi = \Sigma\phi_j$ is the overall phase acquired in the base transport. The key effect of the staircase base is the fact that for $N < 1$ the exponential decrease in the magnitude of $\alpha_B$ is substantially slower than it would be in a base of same width without steps.

The intrinsic current gain $\beta_B$ is equal to $\alpha_B/(1-\alpha_B)$, and the absolute value of $\beta_B$ is greater than unity at $\phi = 2\pi$ (corresponding to a frequency of $2\pi f_T$), provided the absolute value of $\alpha_B$ at that frequency is greater than about 0.5. This translates into the condition that N should be greater than about 19. However, it will be shown below that advantageous results can be attained for $N < 19$, even as small as 2.

The above described effect results from an enhancement of the forward diffusive transport of minority carriers, due to carrier thermalization at every step. This thermalization typically provides the independence of $\alpha_j$'s and substantially restricts particles from returning to a preceding level. It can be shown that, in the absence of recombination, $$J \sim Nen(0)/DW, \quad (4)$$

where J is the steady state current, e is the electron charge, D is the minority carrier diffusivity, $W = NW_j$ is the total base thickness, and n(0) is the minority carrier concentration of the beginning of the first step (or any other step). Equation 4 shows that the presence of the steps results in enhancement by a factor N of the diffusive minority carrier flux, and an equal enhancement of the effective diffusion velocity, which is now $2D/W_j$.

Figure 2:
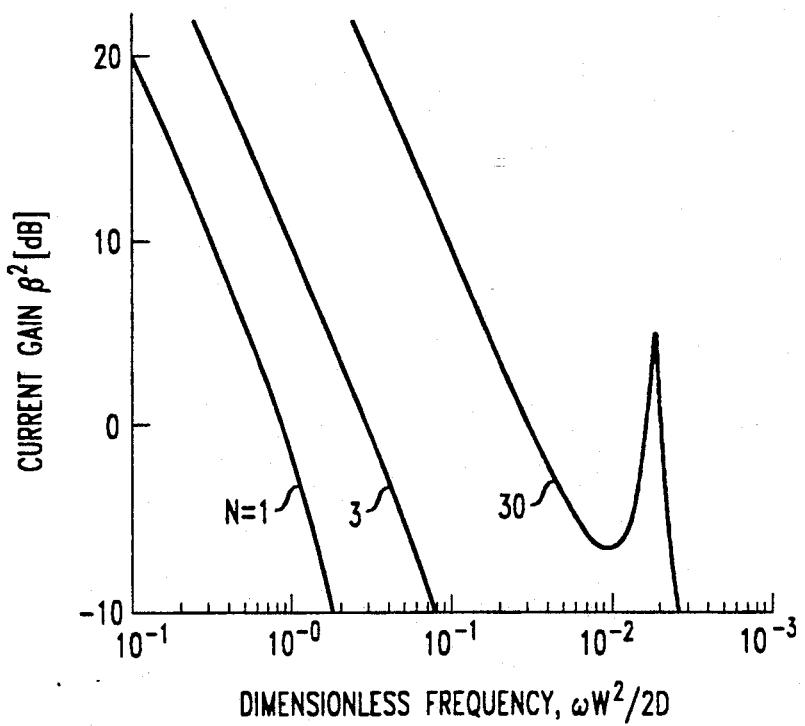
FIG. 2 illustrates current gain as a function of frequency for some exemplary EDTs.

FIG. 2 shows current gain $\beta^2$ vs. dimensionless frequency ($\omega W^2/2D$), for a prior art transistor (N=1), and two analogous EDTs (N=3 and 30). As can be seen, even the N=3 EDT has substantially higher $f_T$ than the, otherwise identical, prior art transistor.

It can also be shown that an extended frequency peak in the unilateral power gain U appears when $\phi$ is about equal to $\pi$. Consideration of the effect of (inevitably present) parasitic extrinsic impedances shows that a peak appears in U at $\phi \sim \pi$ if, for that value of $\phi$, $|\alpha_B|$ is greater than $\omega\tau_x$, where $\tau_x$ is a, readily calculable, parasitics-limited transistor time constant. For instance, for a particular known model of an abrupt-junction EDT, $\tau_x = C_C R_x$, where $C_C$ is the capacitance of the intrinsic base-collector junction, and $R_x = R_E + R_{Ex} + R_{Cx} + R_{Cx}(R_E + R_{Ex})/(R_B + R_{Bx})$, with $R_E$, $R_C$ and $R_B$ referring to the intrinsic value of emitter, collector and base resistance, respectively, and subscript x designating the corresponding parasitic extrinsic resistance.

If the condition $|\alpha_B| > \omega\tau_x$ is met then, in addition to the above discussed "low" frequency regime in which $U > 1$, an EDT can be made active in the frequency range in which $|\alpha_B| \sin(\phi + \theta') + \omega\tau_x \leq 0$, where $\theta' = \omega\tau_c/2$ is half of the collector transit angle. Of course, this condition can only be met if, at the frequency $\omega$, the transistor is not overdamped by the parasitics (i.e., $\omega\tau_x < 1$). For example, if $\omega\tau_x \sim 0.5$, then this condition will typically be met for $N \gtrsim 5$. Although under these circumstances $U < 0$, it is possible to obtain $U \gg 1$ by adding a series resistance. See, for instance, N. Dagli, *Solid State Electronics*, Vol. 33, p. 831 (1990).

Those skilled in the art will appreciate that in the disclosed novel transistor minority carrier transport occurs (at room temperature, but not excluding low temperature operation if desired) by a strongly accelerated forward diffusion process, without requirement of ballistic transport (however, a ballistic transport component may optionally be present). The diffusive process can be adequate for achieving transit time resonance at ultra-high (e.g., >100 GHz) or conventional frequencies, depending on design choices. Moreover, even without the resonance, use of the disclosed accelerated diffusion process can enhance design flexibility for high-performance HBTs, e.g., give greater flexibility in the choice of base thickness and/or doping level.

In a particular exemplary embodiment an article according to the invention comprises an EDT with $N = 2$ or 3, the article comprising means for providing to said EDT electrical signals or frequency below about 100 GHz. In another exemplary embodiment the EDT has $N \geq 5$, and the article comprises means for providing to the transistor signals of approximate frequency $\pi f_{max}$, where $f_{max}$ is the frequency at which the unilateral gain (U) of an otherwise identical comparison transistor with $N = 1$ is unity.

Those skilled in the art will also recognize that, in the limit as N becomes very large, a "staircase" transistor becomes a transistor with continuously graded base (CGB). Such transistors are known. See, for instance, D. L. Miller et al., *Electronics Letters*, Vol. 19, p. 367 (1983), and J. R. Hayes et al., *Electronics Letters*, Vol. 19, p. 410 (1983). Although a transistor with CGB is not a EDT according to the instant invention, I have discovered that a transistor of the former type offers the possibility of enhanced high frequency performance in a region of the parameter space that is typically not of interest for prior art CGBs.

It can be shown that in the CGB transistor, $$\alpha_B(\omega) = \exp(r)[\cos h(\lambda) + (1 + 2i\omega\tau_B/r)^{-\frac{1}{2}} \sin h(\lambda)]^{-1} \quad (5)$$

where $\lambda = (r^2 + 2i\omega\tau_D)^{\frac{1}{2}}$, and $r = \tau_D/\tau_B = Wv/2D$. The characteristic diffusion time $\tau_B = \omega^2/2D$, and the drift time $\tau_B = W/v$, where W is the base width, D is the minority carrier diffusivity, and v is the minority carrier drift velocity.

In the absence of grading, Eq. (5) reduces to $\alpha_B = \cos h^{-1}[(2i\omega\tau_B)^{\frac{1}{2}}]$, which corresponds to Eq. (1) extended to the whole base (i.e., $N = 1$). For r much greater than 1, $\lambda \sim r + i\omega\tau_B + (\omega\tau_B)^2/2r$, and Eq. (5) reduces to $$\alpha_B(\phi) = [\exp(-\phi^2/2r)] \cdot \exp - i\phi. \quad (6)$$

where $\phi = \omega\tau_B(1 - \frac{1}{2}r)$.

Those skilled in the art will recognize, based on the above analysis, that the parameter 2 r in Eq. (6) plays the same role as 3N in Eq. (3a). Thus, CGB transistors with larger r (typically $r \gtrsim 8$) can also exhibit extended frequency operation at $\phi \lesssim \pi$, functionally similar to the situation in EDTs, but with differing underlying physics. Thus, it will be desirable to design and manufacture novel CGB transistors having larger than previously attained values of r, since such transistors can have improved high frequency characteristics, as compared to, otherwise identical, CGB transistors with prior art r value.

I claim:

1. An article comprising a heterojunction bipolar transistor comprising first, second and third semiconductor regions, to be referred to as emitter, base and collector, respectively, and further comprising means for electrically contacting said emitter, base and collector, respectively, the base being intermediate the emitter and collector and having a width $W_B$, the emitter and collector each comprising semiconductor material of a first conductivity type, the base comprising material of a second conductivity type that differs from the first conductivity type and having a base bandgap; CHARACTERIZED IN THAT the base is selected such that the base bandgap comprises $N(N \geq 2)$ regions (designated 1st, 2nd, . . . , j-th, . . . , Nth) of substantially constant bandgap width, with a substantially step wise change ($\Delta_j$) in bandgap width between the j-th region and the (j+1)-th region, the bandgap width decreasing monotonically, without increasing anywhere, in the direction from emitter towards collector, with $\Delta_j > kT$, where k is Boltzmann's constant and T is an absolute transistor operating temperature, and furthermore, $\Delta_j > \Delta_{inelastic}$, where $\Delta_{inelastic}$ is an inelastic minority carrier scattering threshold energy associated with the material of the j'th region.

2. Article according to claim 1, wherein associated with the material of the jth region is an optical phonon frequency $\nu_{opt}$, and wherein $\Delta_{inelastic} = h\nu_{opt}$, where h is Planck's constant.

3. Article according to claim 1, wherein $\Delta_{inelastic}$ is associated with scattering of minority carriers by majority carrier plasmons in the material of the j'th region.

4. Article according to claim 1, wherein T is about 300K.

5. Article according to claim 1, wherein $\Delta_j \geq 30$ meV.

6. Article according to claim 5, wherein $N = 2$.

7. Article according to claim 5, wherein $N \geq 5$, said article comprising means for providing to said base an electrical signal of frequency approximately equal to $\pi f_{max}$, where $f_{max}$ is the frequency at which the unilateral gain U of an otherwise identical comparison transistor with $N = 1$ is unity.

* * * * *